US011835613B2

United States Patent
Mailhe et al.

(10) Patent No.: US 11,835,613 B2
(45) Date of Patent: Dec. 5, 2023

(54) RECONSTRUCTION IN MAGNETIC RESONANCE IMAGING WITH IMAGE REPRESENTATIONS AS IMPLICIT FUNCTIONS IN TIME

(71) Applicant: Siemens Healthcare GmbH, Erlangen (DE)

(72) Inventors: Boris Mailhe, Plainsboro, NJ (US); Dorin Comaniciu, Princeton, NJ (US); Simon Arberet, Princeton, NJ (US); Nirmal Janardhanan, Monmouth Junction, NJ (US); Mariappan S. Nadar, Plainsboro, NJ (US); Hongki Lim, Highland Park, NJ (US); Mahmoud Mostapha, Princeton, NJ (US)

(73) Assignee: Siemens Healthcare GmbH, Erlangen (DE)

(*) Notice: Subject to any disclaimer, the term of this patent is extended or adjusted under 35 U.S.C. 154(b) by 165 days.

(21) Appl. No.: 17/647,608

(22) Filed: Jan. 11, 2022

(65) Prior Publication Data
US 2023/0221392 A1    Jul. 13, 2023

(51) Int. Cl.
*G01R 33/565* (2006.01)
*G01R 33/48* (2006.01)
*G01R 33/56* (2006.01)
*G01R 33/561* (2006.01)

(52) U.S. Cl.
CPC ........ *G01R 33/56509* (2013.01); *G01R 33/4824* (2013.01); *G01R 33/5608* (2013.01); *G01R 33/5611* (2013.01)

(58) Field of Classification Search
CPC ........... G01R 33/4824; G01R 33/5608; G01R 33/5611; G01R 33/56509
See application file for complete search history.

(56) References Cited

U.S. PATENT DOCUMENTS

| | | | |
|---|---|---|---|
| 10,387,765 B2 | 8/2019 | Mailhe et al. | |
| 11,185,249 B2* | 11/2021 | Schlemper | G01R 33/4835 |
| 2018/0315183 A1* | 11/2018 | Milioni De Carvalho | G16H 20/10 |
| 2022/0409161 A1* | 12/2022 | Crabb | A61B 6/504 |

OTHER PUBLICATIONS

Chen, Ricky TQ, et al. "Neural ordinary differential equations." arXiv preprint arXiv:1806.07366. 32nd Conference on Neural Information Processing Systems (NeurIPS 2018), Montréal, Canada. pp. 1-13.

(Continued)

*Primary Examiner* — Gregory H Curran

(57) ABSTRACT

For reconstruction of an image in MRI, unsupervised training (i.e., data-driven) based on a scan of a given patient is used to reconstruct model parameters, such as estimating values of a contrast model and a motion model based on fit of images generated by the models for different readouts and times. The models and the estimated values from the scan-specific unsupervised training are then used to generate the patient image for that scan. This may avoid artifacts from binning different readouts together while allowing for scan sequences using multiple readouts.

19 Claims, 4 Drawing Sheets

(56) References Cited

OTHER PUBLICATIONS

Jaderberg, Max, Karen Simonyan, and Andrew Zisserman. "Spatial transformer networks." Advances in neural information processing systems 28 (2015): 2017-2025.

Sitzmann, Vincent, et al. "Implicit neural representations with periodic activation functions." arXiv preprint arXiv:2006.09661. 34th Conference on Neural Information Processing Systems (NeurIPS 2020), Vancouver, Canada. pp. 1-12.

\* cited by examiner

RECONSTRUCTION IN MAGNETIC RESONANCE IMAGING WITH IMAGE REPRESENTATIONS AS IMPLICIT FUNCTIONS IN TIME

BACKGROUND

The present embodiments relate to magnetic resonance (MR) imaging (MRI). MR acquisition speed is limited by the gradient slew that restricts how fast k-space can be traversed during a readout and by waiting times in the pulse sequence required to generate a desired image contrast between readouts. As a result, MRI acquisitions are a fundamentally dynamical process.

Most MRI techniques rely on acquiring multiple readouts covering different regions of k-space and binning them together to reconstruct an image. The k-space measurements from the multiple readouts are fit to an estimated spatial image in reconstruction. The binning process from readouts of different times reduces temporal resolution. Since the binning is performed in k-space, changes of the MR signal during the acquisition can result in image artifacts. For example, motion results in ghosting artifacts. As another example, T2 decay results in a k-space amplitude modulation, i.e. a filtering of the image. The k-space is typically ordered so low frequencies are acquired with the highest signal so that the effect is a low-pass filter known as T2 blurring.

Some MRI techniques, such a spiral and echo planar imaging (EPI) sampling can acquire full images within a single readout. However, these methods require switching the gradient coils at the limit of their specifications, which can result in deviations from the prescribed k-space trajectory or eddy current aritfacts.

SUMMARY

By way of introduction, the preferred embodiments described below include methods, systems, instructions, and non-transitory computer readable media with instructions for reconstruction of an image in MRI. Unsupervised training (i.e., data-driven) based on a scan of a given patient is used to reconstruct model parameters, such as estimating values of a contrast model and a motion model based on fit of images generated by the models for different readouts and times. The models and the estimated values from the scan-specific unsupervised training are then used to generate the patient image for that scan. This may avoid artifacts from binning different readouts together while allowing for scan sequences using multiple readouts.

In a first aspect, a method is provided for reconstruction of a reconstruction image in MRI. A magnetic resonance system scans a patient, generating different readouts for the patient from different times. Parameters of a contrast model and a motion model are reconstructed based on input of the different times and backpropagation from output images compared to the readout data for the times. The reconstruction image is generated with the reconstructed parameters.

In one embodiment, a pulse sequence where the readouts cover different regions of k-space is used to scan.

In an embodiment, the reconstruction image is represented as an implicit function of time. The reconstruction may extract the contrast model and the motion model as a contrast network and a motion network, respectively, from the readouts.

For reconstruction according to one embodiment, one of the output images is reconstructed for each of the different times where the backpropagation is a loss of a fit of the output image of the time to the readout data for that time.

In one embodiment, the reconstruction is performed with an image formation model having a time input to the contrast model and the motion model. The contrast model outputs a fixed image at one of the times in response to the time input, and the motion model outputs a deformation field at the one of the times in response to the time input. A spatial transformer applies the deformation field to the fixed image, resulting in the output image at the one of the times. As a further embodiment, the reconstruction may estimate the parameters of the contrast model and the motion model using a loss for a fit of the output image at the one of the times to the readout at the one of the times.

The contrast and/or motion networks or models may use various approaches. In one, the contrast model and motion model are contrast and motion neural networks, respectively, where contrast and motion priors comprise hypernetworks trained on other patients. The contrast and motion model are fit to the readouts with regularization enforced by the hypernetworks. In yet another, time-independent, patient-specific parametric maps are estimated with prior knowledge enforced by an image generative model on the maps and the time-resolved images are computed as a patient-independent function of the parametric maps. In that case, the patient-independent function can be implemented as a handcrafted physical model transforming scan-specific parametric maps into the output images or as a neural network jointly trained with the image generative model. In one embodiment of such a neural network patient-independent function, temporal evolution is controlled by a differential equation implemented with a neural ordinary differential equation.

In a second aspect, an MRI system includes a magnetic resonance imager configured to scan a patient. The scanning generates different readouts for the patient from different times. An image processor is configured to reconstruct model parameters from the readouts. The model parameters are for a contrast model and a motion model. The image processor is configured to generate a reconstructed image from the contrast model and the motion model using the reconstructed model parameters. A display is configured to display the reconstructed image.

In one embodiment, the image processor is configured to reconstruct the model parameters using first images for each of the different times. The first images are represented as implicit functions of time, and the first images from the different times are fit to the readouts of the different times for loss to back propagate in the reconstruction of the model parameters.

In another embodiment, the image processor is configured to reconstruct the model parameters as weights of the contrast and motion models based on input of the different times and backpropagation from output images compared to the readout data for the times. The contrast and motion models are neural networks.

In yet another embodiment, the image processor is configured to reconstruct the model parameters with parametric maps where a global convolutional neural network transforms the parametric maps into first images for the different times.

In other embodiments, the image processor is configured to reconstruct the model parameters with parametric maps where a physical model transforms the parametric maps into first images for the different times.

In one embodiment, the image processor is configured to reconstruct the model parameters with parametric maps where an ordinary differential equation solver transforms the parametric maps into first images with temporal evolution controlled by a neural ordinary different equation.

In a third aspect, a method is provided for reconstruction of a reconstruction image in MRI. A magnetic resonance system scans a patient, generating different readouts for the patient from different times. Model parameters are optimized for (a) a motion generative model representing motion dynamics as a spatial transformer network, the motion generative model outputting a deformation field, and (b) a contrast generative model representing contrast dynamically, the deformation field applied to an image output of the contrast generative model. An image is generated from the readouts using the optimized model parameters. The image is displayed.

In one embodiment, the optimization is performed separately for the different readouts where the model parameters are network weights or parametric maps for the motion and contrast generative models. The motion and contrast generative models include a prior model.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

For reconstruction in MRI, the temporal dynamics are resolved by reconstructing an image for each time point with an acquired readout. Rather than a dense voxel grid, the images are represented as implicit functions of time in order to save memory. This is a purely data-driven way to extract motion and contrast models from raw scanner data. The reconstruction for a given patient solves for values of model parameters with optimization by readout, which values and resulting models can then be used to reconstruct.

Figure 1:
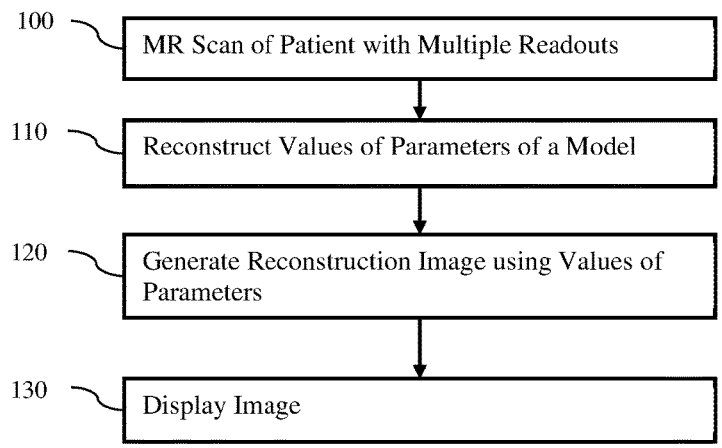
FIG. 1 is a flow chart diagram of one embodiment of a method for reconstruction of a reconstruction image in MRI.

FIG. 1 shows one embodiment of a method for reconstruction of a reconstruction image in magnetic resonance imaging. MRI reconstructions is modeled dynamically with optimization or machine learning performed for each patient. The values of the parameters of the model are determined patient-by-patient based on fit with scan data at different times or for different readouts, allowing for a patient-specific model adapted to the changes over time. That patient-specific model is then used to generate the image.

Additional, different, or fewer acts may be provided. For example, act 100 is replaced with loading readouts from memory. As another example, act 130 is not performed. The acts are performed in the order shown (top to bottom or numerical), but other orders may be used.

Figure 7:
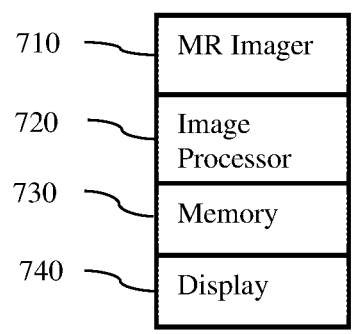
FIG. 7 is a block diagram of one embodiment of a system for MRI reconstruction using imaging represented as an implicit function of time.

The acts are performed by the system of FIG. 7, other systems, an MRI scanner, a workstation, a computer, and/or a server. For example, act 100 is performed by an MR imager. Acts 110 and 120 are performed by a processing component (e.g., image processor) or another machine, such as the medical scanner, a workstation, or a computer. Act 130 is performed by an image processor and display device or screen.

In act 100, a MR system scans a patient. The scan for a given appointment or examination generates different readouts for the patient from different times. A pulse sequence is used where the readouts cover different regions of k-space. The MRI acquisition or scan is a dynamic process sampling different regions of k-space at different times. The pulse sequence may include various waiting times between measuring recieved signals as readouts. The scan includes acquisition of multiple readouts covering the different regions of k-space.

The MR system acquires k-space data representing signal information from a patient. Fourier analysis is performed to reconstruct the data from the k-space into an object or image space. Fourier or inverse Fourier may be used for fitting k-space data to a reconstructed object or image (i.e., transforming between the object and frequency domains for comparison).

The k-space data is made available by or within the MR system. The k-space data may be acquired through transmission over a network or from a memory. A processor may extract the data from a picture archive communications system (PACS) or a medical records database.

In act 110, model parameters of an image model are reconstructed. Rather than reconstructing an image or spatial representation of the patient from a fixed model, the reconstruction determines the values of variables of the image model to use for a particular patient. This determination is unsupervised, relying on the readouts.

This determination operates separately on different readouts. The temporal dynamics for the MR scan are resolved by reconstructing an image for each time point with an acquired readout. Rather than a dense voxel grid, the images are represented as implicit functions of time.

Various image models using separate reconstruction for diffrent times and/or readouts may be used. In one embodiment, the image model includes a contrast model and a motion model. These models represent different aspects of the scan and/or spatial representation.

For reconstructing the model parameters, the values of varaibles or weights used in the model are determined through an iterative or optimization process. For example, the contrast and motion models are neural or other networks (e.g., functions). The weights of the contrast and motion networks are reconstructed through unsupervised machine training or optimization. The time and readout may be used in the image model. For example, time is an input to the model, and backpropagation from output images of the model compared to the readout data for the respective times is used to optimize the values of the model for the input time. In one embodiment, weights of a contrast network and a motion network are reconstructed based on input of the different times and backpropagation from output images of the model compared to the readout data for the times. The readout data may be projected to image space, or the output image may be projected to k-space for determining the loss used in backpropagation. This separate use of readouts and corresponding input of time for the model to generate an image from the time represents the image as an implicit function of time. The temporal dynamics are resolved by reconstructing an image for each time point with an acquired readout. The images generated by the model are used to learn, for a given patient scan, the values of the model parameters to use to generate the image from input of a time.

The contrast and motion models may be the same or different type of model. A neural network, physical model, parametric map, differential equations, and/or other modeling may be used. The contrast and motion models may have the same or different arrangement or architecture (e.g., same functions, number of layers, types of layers, etc.).

In one embodiment, the image model, contrast model, and/or motion model are machine learning networks, such as neural networks. For example, a convolutional neural network (CNN) or fully connected neural network (FCN) architecture is used. The contrast and motion networks are generative networks for generating an image from an input, such as the input of time. Any machine-learnt generative model may be used. For example, the generative model is a deep learnt model using Restricted Boltzmann Machines (RBM), Deep Belief Network (DBN), Neural Autoregressive Density Estimators (NADE), Variational Auto-Encoders (VAE), Denoising Auto-Encoders (DAE), Generative Adversarial Networks (GAN), extensions thereof, or other deep learning approaches for generative modeling.

The contrast and motion networks are machine trained using unsupervised learning. The learnable parameters of the networks are learnt based on optimization using the scan data (e.g., readouts) from the patient. This is a purely data-driven way to extract motion and contrast models from raw scanner data for the patient.

In other embodiments, the model generates through phyiscal modeling or other non-machine learning modeling. The values of the variables used in the model are optimized by the processor.

The image model is designed to generate an output image, such as an output image for each of the times. In training (e.g., machine training or optimizing) the model, an output image is reconstructed for each time based on the current values of the model parameters (e.g., learnable weights) and a loss is determined between the output image and the readout for the time. The backpropagation uses the fit of the output image of the time to the readout data for that time. The motion and contrast generative models can be independent or joint (e.g. to model patient spasms at contrast injection time or dependencies between physical parameters impacting contrast evolution and biomechanical parameters impacting tissue deformation).

Stochastic or other sampling may be used to optimize (e.g., machine learn) the weights for a given time and/or for all the times. Other optimizations, such as gradient descent, may be used. The complete system or image model may be trained in an unsupervised way using a Maximum A Posteriori loss that takes both data fit and prior generative models (e.g., models trained from data for other patients) into account. During unsupervised training, the loss is backpropagated to both the shared weights and the individual reconstructions (e.g., image from the contrast model and deformation field from the motion model). After unsupervised training, a distillation step can be performed where a supervised network is trained to reproduce the final reconstructions computed by unsupervised training.

Figure 2:
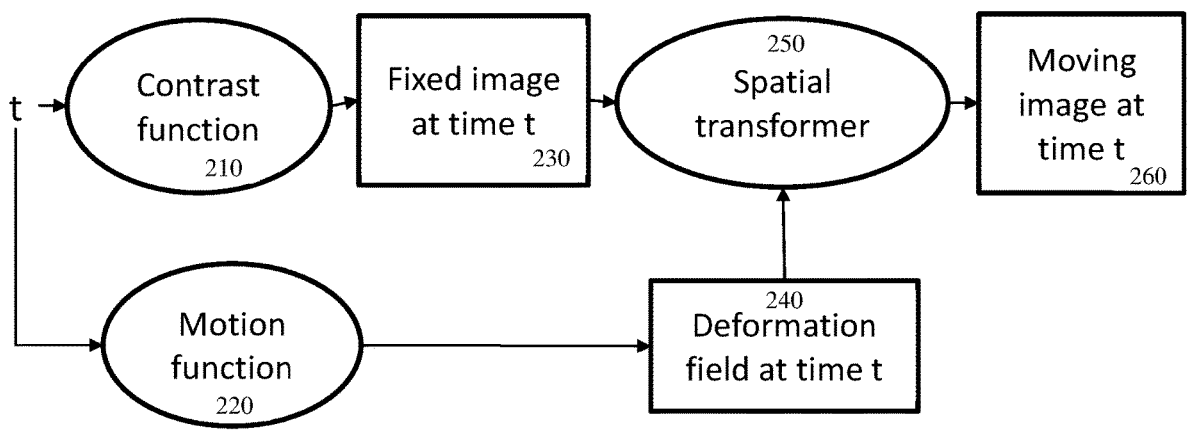
FIG. 2 illustrates an example imaging model for reconstruction from individual readouts using contrast and motion functions.

FIG. 2 shows one embodiment of an image formation model for reconstructing model parameters based time input and backpropagation from fir of readout to output image. The image formation model uses time, t, as input to a contrast function 210 (e.g., contrast network) and a motion function 220 (e.g., motion network). The contrast function 210 and/or motion function 220 include parameters to be learned through optimization for a given scan. The contrast function 210 generates a fixed image 230 for time t in response to input of the time value for t. The motion function 220 generates a deformation field 240 for time t in response to input of the time value for t. Thus, the fixed image 230 and deformation field 240 are generated in response to input of a particular time using the current values of the model parameters. The spatial transformer 250 is a function applying the deformation field 240 to the fixed image 230. The spatial transformer 250 is a fixed network or function, so does not have any learnable parameters. In other embodiments, the spatial transformer 250 also has learnable parameters. The spatial transformer 250 outputs a moving image 260 at time t. The image 260 represents the patient at time t based on a readout. By repeating input of different values of the time, the moving or output image 260 for a given time is one image in a sequence or video over time.

This image formation model indicates how to compute the output images assuming all parameters are known. The reconstruction learns the values of the parameters through optimization. The optimization optimizes for each time separately or optimizes across all of the times for which there are readouts. The motion dynamics are modeled as a spatial transformer network (i.e., an implicit function of time) that outputs the deformation field 240 that is then applied to the image 250 obtained from the contrast dynamics network 210. Other models using different functions or transforms may be used.

In this image model, the image is represented by its contrast and motion functions (i.e., networks) 210, 220. The reconstruction task is estimation of the weights of those networks. The weights of the contrast network and the motion network are estimated using a loss for a fit of the output image 260 at the one of the times to the readout at the one of the times. The model parameters are optimized for (a) a motion generative model (e.g., motion function 220) representing motion dynamics as a spatial transformer network and (b) a contrast generative model (e.g., contrast function 210) representing contrast dynamically. The motion generative model outputs the deformation field 240 applied to an image 230 output by the contrast generative model.

Losses based on different values of the weights may be generated to optimize the values of the weights for that time or across multiple times. For example, the optimization is performed separately for the different readouts. As another example, the optimization is performed across times where the losses for different times and corresponding readouts are used to find weights for the contrast and motion functions 210, 220 to generate images for different times. To avoid computing all the time points, the likelihood can be evaluated stochastically on a random subset of the measurements at every iteration.

The motion and contrast generative models (e.g., contrast and motion functions 210, 220) may include a prior model. Prior models based on reconstruction of the weights for other patients or groups of patients may be applied to the network weights, such as implementing the contrast and motion functions 210, 220 as hypernetworks. The prior model fills any gaps with a priori knowledge of what a reconstruction should look like. Missing data is filled by this generative model. Since the weights or parameters of the image formation model are being reconstructed, the prior model fills gaps in the values of the parameters, such as with an initialization and/or explicit regularization. The prior model may be a trained neural network, such as a trained generative network for generating values of model parameters.

Other image formation models may be used. In general, the image formation model uses unsupervised probabilistic latent learning using incoming data y, the imaging model A, reconstruction parameters x, and model parameters θ. The optimization or learning may be represented as:

$$-\log p_\theta(x, y) = \frac{1}{2\sigma^2}\|y_t - A_t f(t, x, \theta)\|_2^2 - \log p_\theta(x)$$

The reconstruction problem is then represented as:

$$\forall y, \hat{x}(y, \theta) = \mathrm{argmax}_x \log p_\theta(x, y)$$

that provides the learning problem represented as:

$$\hat{\theta} = \mathrm{argmax}_\theta \log p_\theta(\hat{x}(y, \theta), y)$$

where x are the patient-specific parameters to reconstruct for each scan both during offline training and online reconstruction, and theta are the patient-independent parameters of the prior models to be optimized during offline training then used when reconstructing new scans. The contrast and motion networks implement f(t,x,θ). The full training formulation depends on the chosen formalism for the generative model $p_\theta(x)$ (contrast function 210 and motion function 220), such as implementing these generative models as denoising auto-encoders, variational auto-encoder, or a normalizing flow.

FIGS. 3-6 show different implementations for the contrast and/or motion models. These implementations may be used for other imaging models. The implementations have different variables or parameters for which values are reconstructed, different corresponding reconstruction states, and/or different corresponding training parameters. For example, the reconstruction reconstructs network weights or parametric maps for the generative models.

Figure 3:
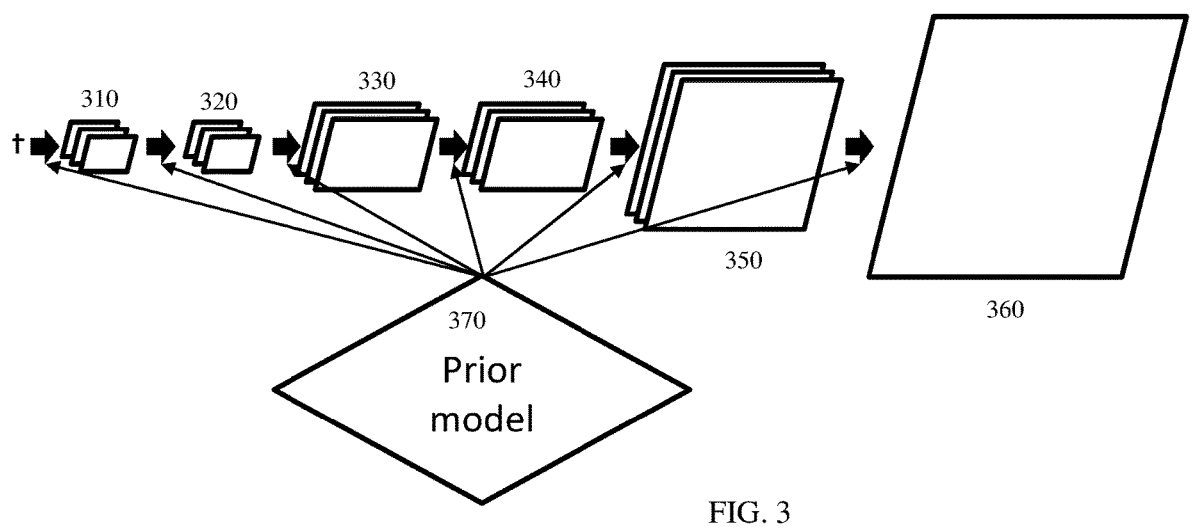
FIG. 3 illustrates an example motion or contrast model using a hypermodel for generating an image.

FIG. 3 shows a neural network formed from various layers 310-350, such as convolutional layers of a convolutional neural network architecture, for generating a spatial representation from an input. Using the prior model 370 provides a hypernetwork for the contrast and/or motion network. The prior model 370 provides or regularizes values for the learnable parameters based on other patients or as learned previously. The generative network 310-350 has an input for the time, t, to output an image 360, such as a fixed image or a deformation field.

This is a fully data-driven model where images are generated from scratch, like in a deep image prior network. The reconstruction state is the network weights, such as convolution kernels. The training parameters are the prior model 370, such as the hypernetwork. The reconstruction task fits the network to every readout of a scan. In that case, the network architecture acts as an implicit regularizer and additional regularization is enforced by learning a generative hypernetwork, i.e. a generative model of the network weights.

Figure 4:
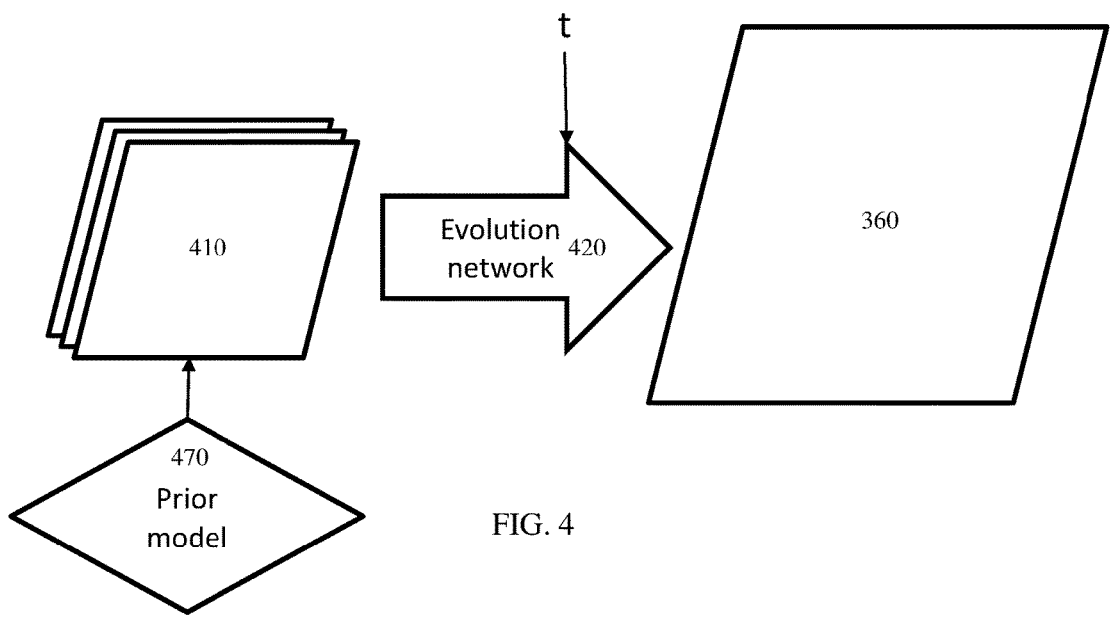
FIG. 4 illustrates an example motion or contrast model using parameter maps and learned evolution for generating an image.

FIG. 4 shows an alternative implimentation using a parametric model. The model estimates parametric maps 410 with prior knowledge enforced by an image generative model (prior model 470) on the maps. The evolution network 420 is a neural network, such as a global convolutional neural network (CNN) (e.g., 1×1 CNN) and transforms the scan-specific parametric maps 410 into images 360. Parametric maps are used with a dynamical model, such as based on known physics or learnt using a NODE. The evolution network 420 may use information from other times to predict for the input time. The reconstruction state is the parametric maps 410. The training parameters are the prior model 470 (e.g., an image generative model) and/or the evolution network 420 (e.g., an image-to-image (I2I) network).

The network architecture is either inspired or fully informed by physical modeling. The implicit function of time is represented as a function applied to a tensor of the parametric maps 410. That function is shared for all cases. The reconstruction task estimates the parametric maps 410, and prior knoledge is enforced by a multichannel image generative model (prior model 470) on the maps 410.

Figure 5:
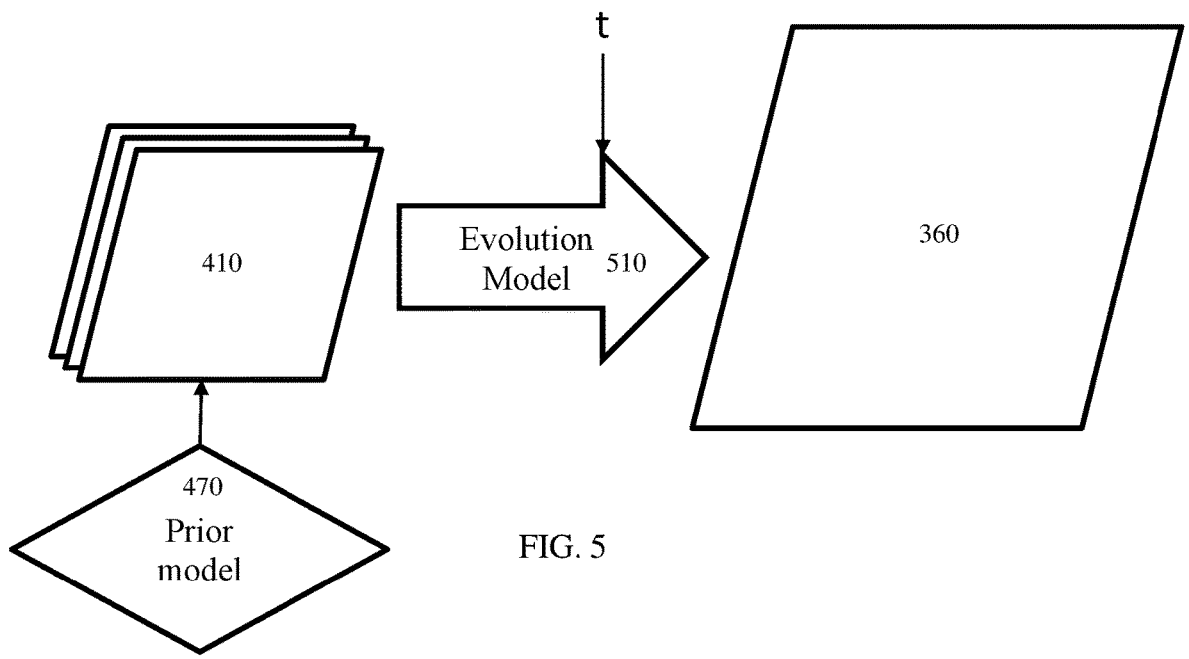
FIG. 5 illustrates an example motion or contrast model using a physical model for generating an image.

FIG. 5 shows an alternative implementation using a physical model rather than the evolution network 420 of FIG. 4. The contrast and/or motion model (e.g., network) are reconstructed where the physical model (i.e., evolution model 510) transforms the scan-specific parameter maps 410 into the output image 360. Rather than using a neural network, the evolution model 510 is a handcrafted function. The temporal function is handcrafted to replicate a known physical model (e.g. Bloch simulation or pharmacokinetic modeling). The evolution model 510 may use information from other times to predict for the input time. In this parametric model, the handcrafted evolution model 510 transforms for model-based reconstruction with additional prior 470 on the parametric maps 410. The reconstruction state is the parametric maps 410 and the training parameters are the prior model 470 (i.e., image generative model) and/or variables of the evolution model 510. If the evolution model 510 is handcrafted (programmed rather than machine learned), the evolution model 510 might not have any free parameters, or only a few. If the evolution model 510 is a neural network or NODE, then the evolution model 510 is just more network weights.

Figure 6:
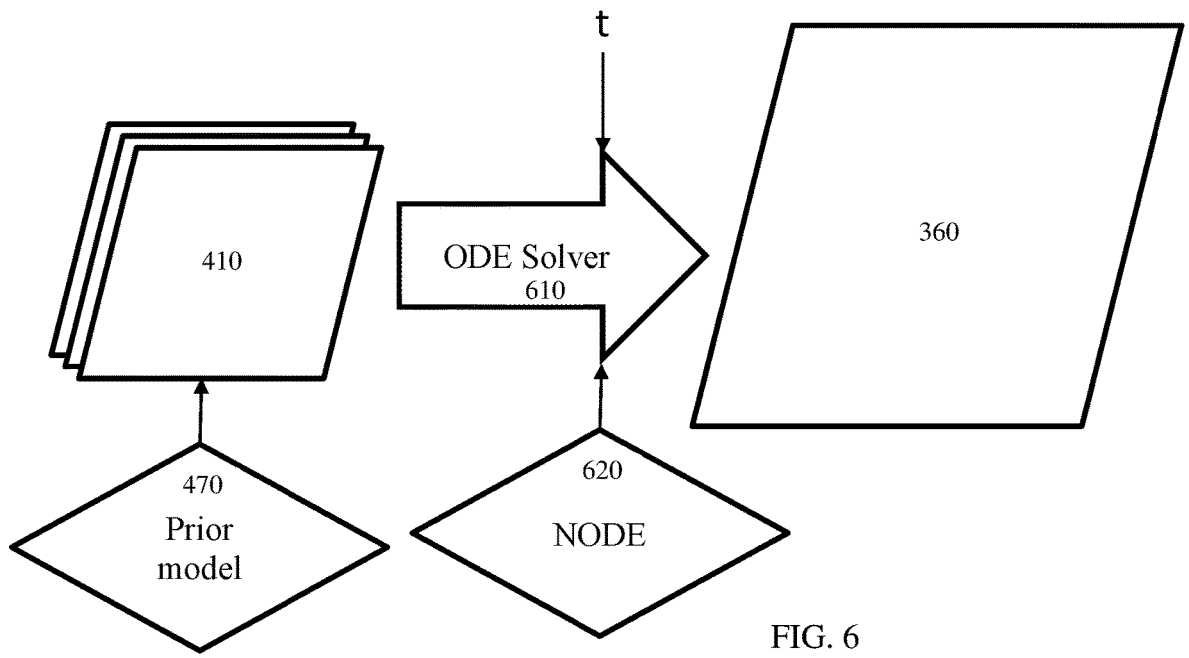
FIG. 6 illustrates an example motion or contrast model using ordinary differential equation solver for generating an image.

FIG. 6 shows yet another alternative implementation with a neural ordinary differential equation (NODE) 620. This NODE-based model bridges between the physical modeling of FIG. 5 and the parametric model of FIG. 4. The temporal evolution is assumed to be controlled by an unknown differential equation implemented with the NODE 620. An ODE solver 610, e.g., Runge-Kutta method, computes the image 360 from the parametric maps 410. The reconstruction state is the parametric maps 410. The training parameters are the prior model 470 and/or the NODE 620.

The NODE-based model is data-driven (i.e., implemented as a network that is trained at the same time as the image generative model). The NODE 620 may be a one-dimensiopnal (1D) function of time applied at every voxel or a CNN to model spatial diffusion over time.

Referring again to FIG. 1, the reconstruction image is generated in act 120. The learned weights (parameters) of the image formation model are used with the model. Since the model is generative, the input time and/or other input are provided to the model. The model generates the reconstructed image using the learned weights for that scan. The image is generated from the readouts using the scan-specific optimized model parameters.

The final reconstruction depends on the downstream task. For example, 30 video frames are reconstructed to make sense of the data to run some quantitative analytics, but a radiologist would only look at four time points. The images not using the quantitative analytics may be discarded. Whatever is clinically relevant is kept. For example, motion may be a nuisance to discard in some cases (e.g., head scans) but contain all the clinical information in others (dynamic cardiac scans).

The MR image represents a one, two, or three-dimensional region of the patient. For example, the MR image represents an area or slice of the patient as pixel values. A three-dimensional volume may be represented as pixel values by rendering to a two-dimensional format. As another example, the MR image represents a volume or three-dimensional distribution of voxels. Values are provided for each of multiple locations distributed in two or three dimensions. The MR image is acquired as a frame of data. The frame of data represents the scan region at a given period. The dataset may represent the area or volume over time, such as providing a 4D representation of the patient.

In act 130, the reconstructed image is displayed on a display screen. The generated image is displayed for diagnosis. The image may be transmitted over a network for display, displayed on an MR scanner, and/or loaded from memory for display. In alternative embodiments, the image is stored in memory.

FIG. 7 shows one embodiment of an MRI system. The system uses patient and/or scan-specific optimization of model parameters through reconstruction of the model parameters. The values for the parameters from the reconstruction are used with the model to then generate a reconstructed image.

The system includes an MR imager 710, a processor 720, a memory 730, and a display 740. Additional, different, or fewer components may be provided. For example, a computer network and database are provided. In another example, a user interface is provided.

The processor 720, memory 730, and display 740 are part of the medical MR imager 710. Alternatively, the processor 720, memory 730, and display 740 are part of an archival and/or image processing system, such as associated with a medical records database workstation or server, separate from the MR imager 710. In other embodiments, the processor 720, memory 730, and display 740 are a personal computer, such as desktop or laptop, a workstation, a server, or combinations thereof. The processor 720, display 740, and memory 730 may be provided without other components for acquiring data by scanning a patient.

The MR imager 710 is a MR system or scanner. The MR system includes a main field magnet, such as a cryomagnet, and gradient coils. A whole-body coil is provided for transmitting and/or receiving. Local coils may be used, such as for receiving electromagnetic energy emitted by atoms in response to pulses. Other processing components may be provided, such as for planning and generating transmit pulses for the coils based on the sequence and for receiving and processing the received k-space data. The received k-space data is converted into object or image space data with Fourier processing.

The MR imager 710 is configured to scan a patient. The scanning includes a pulse sequence providing for multiple readouts. The different readouts are associated with different times and regions of k-space. The whole or complete scan of the patient and corresponding multiple readouts measured over the period of scanning may be used to reconstruct an image of the patient for that examination or scan.

The memory 730 may be a graphics processing memory, a video random access memory, a random-access memory, system memory, cache memory, hard drive, optical media, magnetic media, flash drive, buffer, database, combinations thereof, or other now known or later developed memory device for storing image data. The memory 730 is part of the MR imager 710, part of a computer associated with the processor 720, part of a database, part of another system, a picture archival memory, or a standalone device.

The memory 730 stores k-space data (i.e., readouts), an image model (e.g., contrast model, motion model, and spatial transform), images, deformation fields, motion images, values of model parameters (e.g., weights), and/or other data discussed herein. The memory 730 may store data during processing for reconstructing the values of the model parameters and for generating an image using the reconstructed values of the model parameters.

The memory 730 or other memory is alternatively or additionally a non-transitory computer readable storage medium storing data representing instructions executable by the programmed processor 720 for reconstructing model parameters and generating an image. The instructions for implementing the processes, methods and/or techniques discussed herein are provided on non-transitory computer-readable storage media or memories, such as a cache, buffer, RAM, removable media, hard drive, or another computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 720 is a general processor, central processing unit, control processor, graphics processor, digital signal processor, three-dimensional rendering processor, image processor, application specific integrated circuit, field programmable gate array, artificial intelligence (AI) processor or accelerator, digital circuit, analog circuit, combinations thereof, or other now known or later developed machine optimizing using a generative model and physics model. The processor 720 is a single device or multiple devices operating in serial, parallel, or separately. The processor 720 may be a main processor of a computer, such as a laptop or desktop computer, or may be a processor for handling some tasks in a larger system, such as in the MR imager 710. The processor 720 is configured by instructions, firmware, hardware, and/or software to perform the acts discussed herein.

The image processor 720 is configured to reconstruct model parameters from the readouts. For example, the model parameters are for an image model having a contrast model and a motion model. The weights for the contrast and motion models are reconstructed.

The reconstruction uses optimization by time. The image processor 720 is configured to reconstruct the model parameters using different images for each of the different times. These images are represented as implicit functions of time. The images from the different times are fit to the readouts of the different times for loss to back propagate in the reconstruction of the model parameters. In one embodiment, the image processor 720 is configured to reconstruct the model parameters as weights of the contrast and motion models based on input of the different times and backpropagation from output images compared to the readout data for the times.

The image model (e.g., contrast and motion models) may use neural networks for a data driven approach to unsupervised learning of the values of the model parameters based on fit with the scan for the patient. In other embodiments, parametric maps are used. For example, a global convolutional neural network transforms the parametric maps into images for the different times. In yet other embodiments, a physical model transforms the parametric maps into images for the different times. As another embodiment, an ordinary differential equation solver transforms the parametric maps into images with temporal evolution controlled by a neural ordinary different equation.

The image processor 720 is configured to generate a reconstructed image. The learned or optimized values for the model parameters are used with the model to generate the image. For example, the contrast model and the motion model use the reconstructed model parameters to generate an image of the patient.

The display 740 is a monitor, LCD, projector, plasma display, CRT, printer, or other now known or later developed devise for outputting visual information. The display 740 receives images, graphics, text, quantities, or other information from the processor 720, memory 730, and/or MR imager 710. One or more reconstructed MR images are displayed. The images are of a region of the patient.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for reconstruction of a reconstruction image in magnetic resonance imaging, the method comprising:
scanning, by a magnetic resonance system, a patient, the scanning generating different readouts for the patient from different times;
reconstructing parameters of a contrast model and a motion model based on input of the different times and backpropagation from output images compared to the readout data for the times; and
generating the reconstruction image with the reconstructed parameters.

2. The method of claim 1 wherein scanning comprises scanning with a pulse sequence where the readouts cover different regions of k-space.

3. The method of claim 1 wherein reconstructing comprises reconstructing the contrast and motion models represented as implicit functions of time.

4. The method of claim 1 wherein reconstructing comprises reconstructing one of the output images for each of the different times where the backpropagation is a loss of a fit of the output image of the time to the readout data for that time.

5. The method of claim 1 wherein reconstructing comprises extracting the contrast model and the motion model as a contrast network and a motion network, respectively, with the parameters comprising weights, from the readouts.

6. The method of claim 1 wherein reconstructing comprises reconstructing with an image formation model having a time input to the contrast model and the motion model, the contrast model outputting an fixed image at one of the times in response to the time input, the motion model outputting a deformation field at the one of the times in response to the time input, a spatial transformer applying the deformation field to the fixed image, resulting in the output image at the one of the times.

7. The method of claim 6 wherein reconstructing comprises estimating the parameters of the contrast model and the motion model using a loss for a fit of the output image at the one of the times to the readout at the one of the times.

8. The method of claim 1 wherein the contrast model and motion model comprise contrast and motion neural networks, respectively, with contrast and motion priors comprising hypernetworks trained on other patients, wherein reconstructing comprises fitting the contrast and motion models to the readouts with regularization enforced by the hypernetworks.

9. The method of claim 1 wherein reconstructing comprises estimating patient-specific parametric maps with prior knowledge enforced by an image generative model on the patient-specific maps, where time-resolved images are computed as a patient-independent function of the patient-specific parametric maps.

10. The method of claim 9 wherein the patient-independent function is (1) a handcrafted physical model transforming scan-specific parametric maps into the output images or (2) a neural network jointly trained with the image generative model in the reconstructing.

11. The method of claim 9 wherein reconstructing comprises controlling temporal evolution by a differential equation implemented with a neural ordinary differential equation.

12. A magnetic resonance imaging (MRI) system comprising:
a magnetic resonance imager configured to scan a patient, the scanning generating different readouts for the patient from different times;
an image processor configured to reconstruct model parameters from the readouts, the model parameters being for a contrast model and a motion model, and configured to generate a reconstructed image from the contrast model and the motion model using the reconstructed model parameters; and
a display configured to display the reconstructed image.

13. The MRI system of claim 12 wherein the image processor is configured to reconstruct the model parameters using first images for each of the different times, the first images represented as implicit functions of time, and the first images from the different times fit to the readouts of the different times for loss to back propagate in the reconstruction of the model parameters.

14. The MRI system of claim 12 wherein the image processor is configured to reconstruct the model parameters as weights of the contrast and motion models based on input of the different times and backpropagation from output images compared to the readout data for the times, the contrast and motion models comprising neural networks.

15. The MRI system of claim 12 wherein the image processor is configured to reconstruct the model parameters with parametric maps wherein a global convolutional neural network transforms the parametric maps into first images for the different times.

16. The MRI system of claim 12 wherein the image processor is configured to reconstruct the model parameters with parametric maps wherein a physical model transforms the parametric maps into first images for the different times.

17. The MRI system of claim 12 wherein the image processor is configured to reconstruct the model parameters with parametric maps wherein an ordinary differential equation solver transforms the parametric maps into first images with temporal evolution controlled by a neural ordinary different equation.

18. A method for reconstruction of a reconstruction image in magnetic resonance imaging, the method comprising:

scanning, by a magnetic resonance system, a patient, the scanning generating different readouts for the patient from different times;

optimizing model parameters for (a) a motion generative model representing motion dynamics as a spatial transformer network, the motion generative model outputting a deformation field and (b) a contrast generative model representing contrast dynamically, the deformation field applied to an image output of the contrast generative model;

generating an image from the readouts using the optimized model parameters; and displaying the image.

19. The method of claim 18 wherein optimizing comprises optimizing separately for the different readouts where the model parameters are network weights or parametric maps for the motion and contrast generative models, the motion and contrast generative models including a prior model.

* * * * *